US006812721B1

(12) United States Patent
Cha

(10) Patent No.: US 6,812,721 B1
(45) Date of Patent: Nov. 2, 2004

(54) PC MAINBOARD TEST FIXTURE BACKGROUND OF THE INVENTION

(75) Inventor: Chao-Wang Cha, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/661,595

(22) Filed: Sep. 15, 2003

(51) Int. Cl.[7] .............................................. G01R 31/02
(52) U.S. Cl. ..................... 324/755; 324/158.1; 324/754
(58) Field of Search ................................ 324/755, 765, 324/754, 158.1, 762, 761, 758, 537; 439/73, 482, 700

(56) References Cited

U.S. PATENT DOCUMENTS 5,898,313 A * 4/1999 Cugini ....................... 324/758

6,294,908 B1 * 9/2001 Belmore et al. .......... 324/158.1
6,437,557 B1 * 8/2002 Smith ....................... 324/158.1

* cited by examiner

*Primary Examiner*—Evan Pert
*Assistant Examiner*—Jimmy Nguyen
(74) *Attorney, Agent, or Firm*—Bacon & Thomas PLLC

(57) ABSTRACT

The present invention is to provide a PC mainboard test fixture for an operator by moving a hanging pedestal installed in the test fixture down toward a connecting port of the mainboard until a positioning board thereof presses on the connecting port and stops on the connecting port, and then the pressure from the hanging pedestal makes the connecting pins of an extension connector installed thereof pass through the positioning holes of the positioning board and reach the connecting port accurately, enabling an accompanied circuit board thereof to be properly connected with the mainboard for testing.

10 Claims, 6 Drawing Sheets

PC MAINBOARD TEST FIXTURE

BACKGROUND OF THE INVENTION

FIELD OF THE INVENTION

This invention relates generally to a test fixture and, more specifically, to a PC mainboard test fixture that offers faster and accurate test environment for PC mainboards to reduce the mistakes of human errors, to reduce manpower and to speed up the test speed.

DESCRIPTION OF THE PRIOR ART

Heretofore, it is known that a manufacturer of a PC mainboard (for example: PC, Server, or Industrial PC . . . ) will test the circuitry of the mainboards before shipping out to make sure the mainboards from malfunction. On the traditional PC mainboard assembly line, the testing procedures is done manually to have the PC mainboard and all the peripherals (for example: CD ROM, Hard Disk Drive, Memory Card, Network Card, Heat Sink . . . ) connect together, then do the simulation tests (for example: Internet linking, Memory data fetch and store, Network Data Packet transmission . . . ), operators judge if the mainboard is function properly by the results of the test routines.

However, manual test is very slow and consumes a lot of manpower; in mass production environment, such scheme cannot meet the requirement of higher production pace and lower cost, manual test also introduces human errors, operators plug in peripherals (Memory Card, Network Card for example) in wrong positions to damage the components on the mainboards. All the manufacturers need a low cost, automatic and accurate test fixture.

SUMMARY OF THE INVENTION

It is therefore a primary object of the invention to provide a PC mainboard test fixture compromising a platform to install the mainboard, a frame locates on the platform the frame consists of one or a plurality number of hanging pedestal installed freely, a board slot for circuit board (Network card, Memory card . . . ) to fit in is beneath every hanging pedestal, a plurality number of extension connector are beneath every board slot to connect to the circuit board. a positioning board is beneath every extension connector, the positioning board corresponds to the location of the connecting pin of the extension connector, a positioning hole is for the corresponding connecting pin to pass through, when the connecting pin passes through the corresponding positioning hole, by the guidance and positioning of the positioning hole, the connecting pin can move up and down in a preset path. Two inclined angle that can prevent the fastener of the connecting port of the mainboard from closing are on both sides of the positioning board, the inclined angle should incline inward to fit the angle of the fastener to prevent the fastener from covering top of the extension. Operators have the hanging pedestal move down toward the connecting port of the mainboard until the positioning board presses on the connecting port; the positioning board stops on the connecting port, the pressure from the hanging pedestal makes the connecting pin of the extension connector pass through the positioning hole of the positioning board and reach the connecting port accurately, the mainboard can be tested with accompanied circuit board.

It is an objective of this invention to provide a PC mainboard test fixture in which several connecting plate link the support rod of the frame of the hanging pedestal, a plurality number of screw holes are on the connecting plate to have the connecting component to link the connecting plate and the support rod to stable the hanging pedestal and the frame, operators can loose the connecting component and move the hanging pedestal right or left for proper position. Both ends of the support rod wrap around the round tube on both sides of the frame, such structure makes the support rod can move forward or backward; operators can adjust the position of the support rod to make the hanging pedestal to the position of the connecting port of the mainboard.

It is still an objective of this invention to provide a PC mainboard test fixture in which the platform consists of a the stationary board and an adjustable board; a base for the mainboard to install is above the adjustable board, a plurality number of wheels in vertical direction in equal distance are installed on the bottom of the adjustable board, the stationary board locates inside the frame that is beneath the adjustable board; a plurality number of wheel slots are beneath those wheels and above the stationary board, the wheels can roll inside the wheel slots to make the adjustable board move forward or backward on the stationary board; operators can push the mainboard into the frame for testing, after testing, the mainboard can be pulled out from the frame.

It is still an objective of this invention to provide a PC mainboard test fixture in which a heat sink slot to install a heat sink is beneath the hanging pedestal, when operators perform heat dissipation test, the hanging pedestal is moved up to the position of the CPU of the mainboard, then pull the pressing handle of the hanging pedestal to have the heat sink slot move down and have the heat sink on the surface of the CPU of the mainboard for test.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DESCRIPTION OF THE PREFERRED EMBODIMENT

Figure 1:
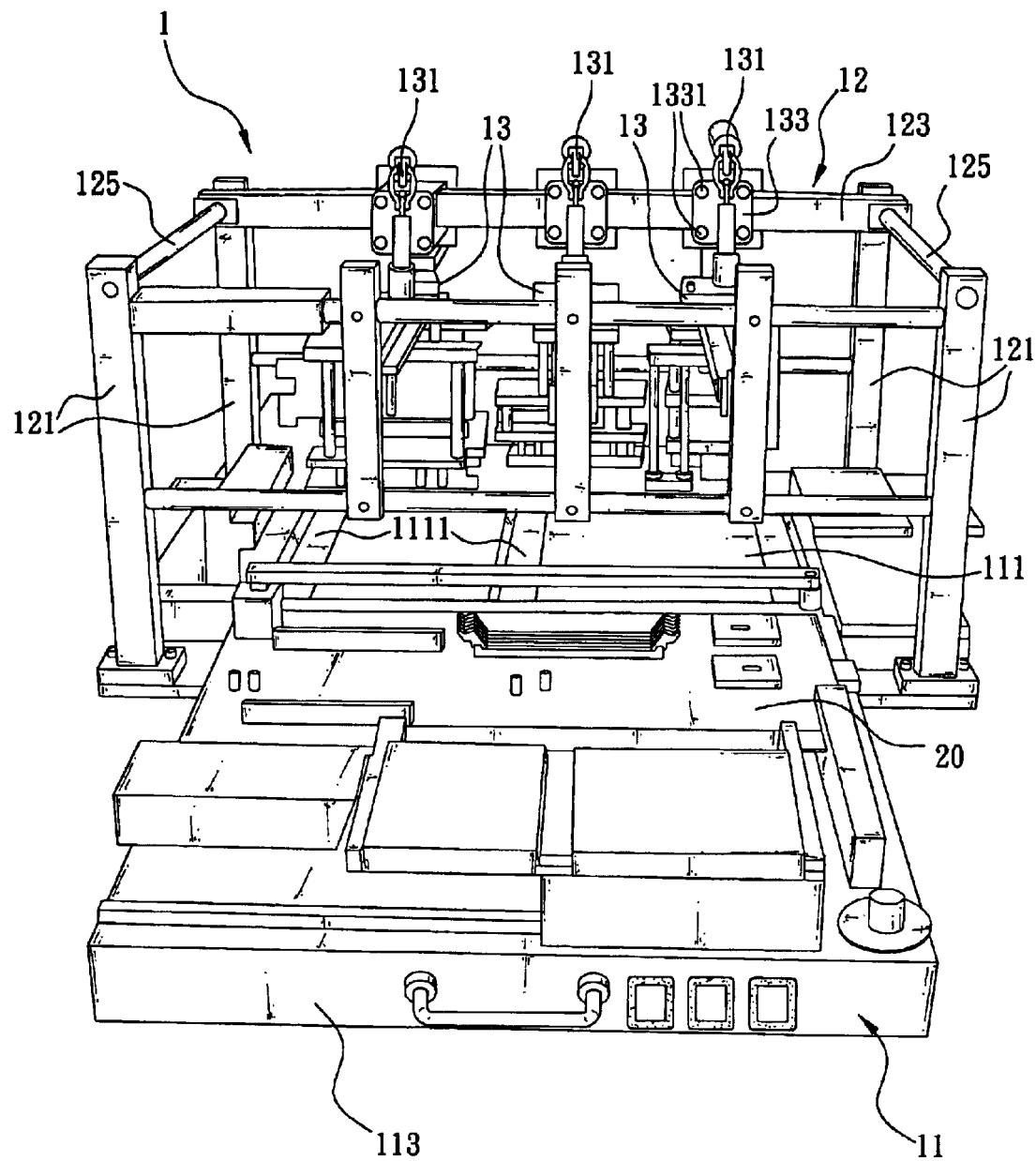
FIG. 1 is a perspective view of the present invention.
Figure 2:
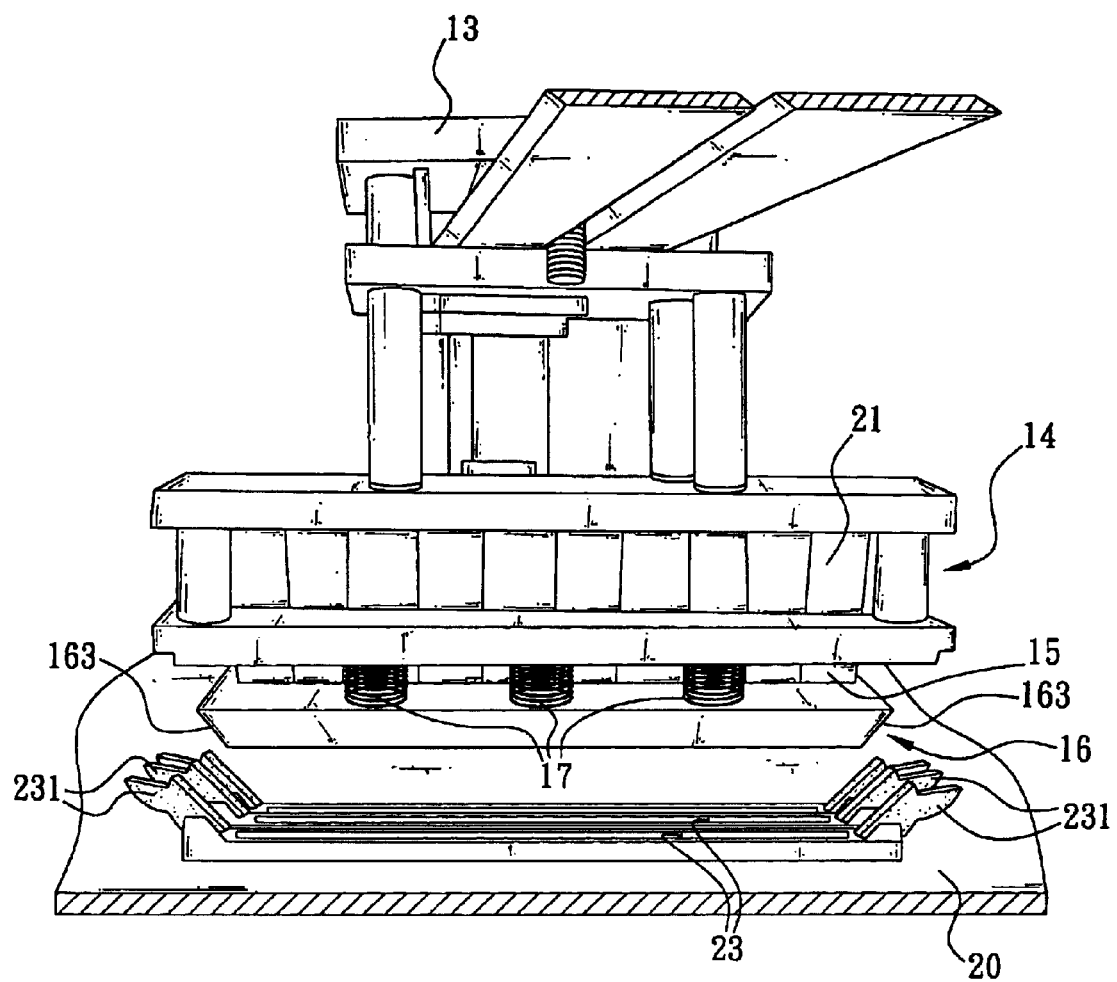
FIG. 2 is a partial perspective view of the present invention.

Referring to FIG. 1, the present invention is fixture (1) that further composed of a platform (11) to install the mainboard (20), a frame (12) locates on the platform (11); the frame (12) consists of a plurality number of pole (121), a plurality number of round tube (125) as beam and several support rod (123) installed among those pole (121), one or a plurality number of hanging pedestal (13) are installed freely on the support rod (123) of the frame (12); referring to FIG. 1 and FIG. 2, a pressing handle (131) is on each of the hanging pedestal (13) to move the hanging pedestal (13) up or down, a board slot (14) for circuit board (21) (Network card, Memory card . . . ) to fit in is beneath every hanging pedestal (13), a plurality number of extension connector (15) are beneath every board slot (14) to connect to the circuit board (21).

Figure 3:
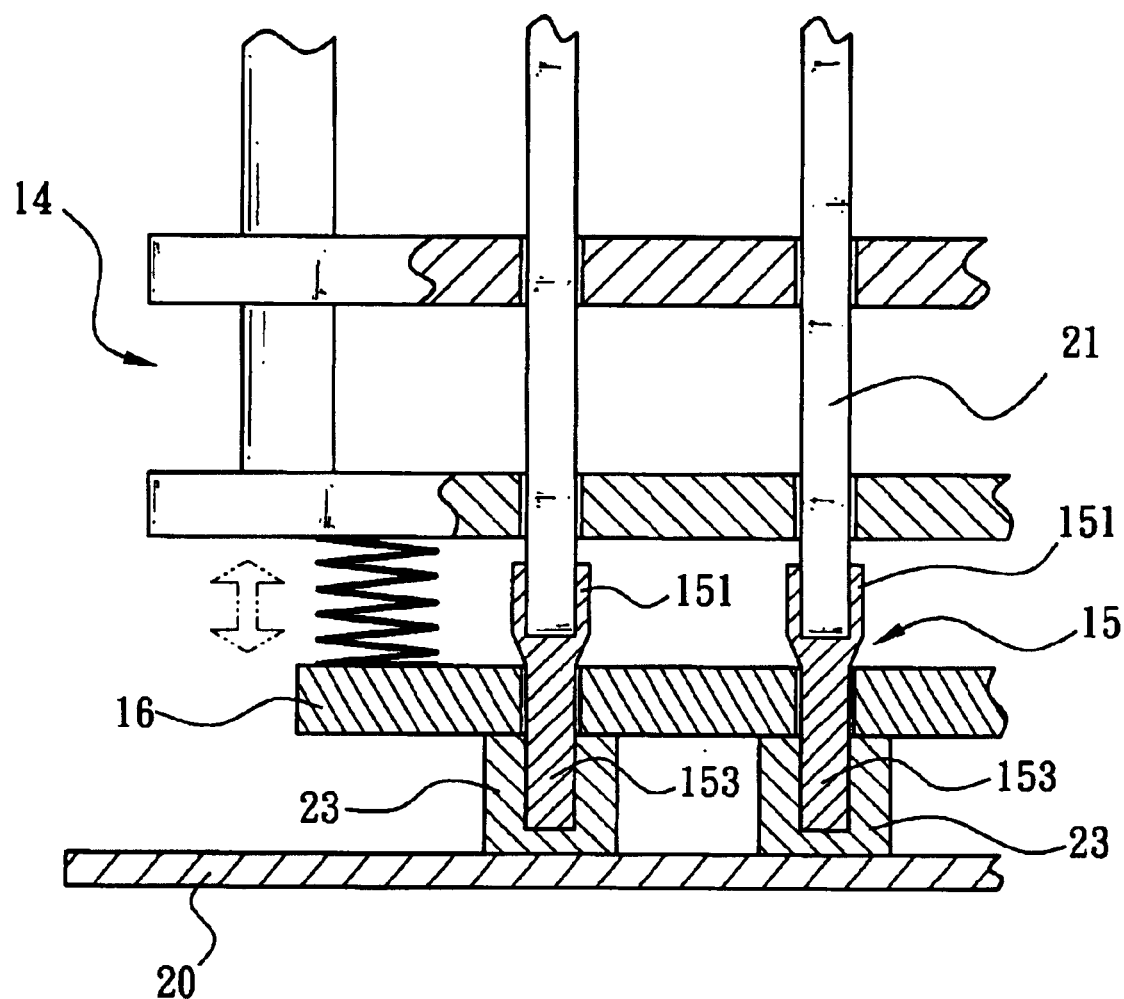
FIG. 3 is a cross-sectional view of the extension connector of the present invention.
Figure 4:
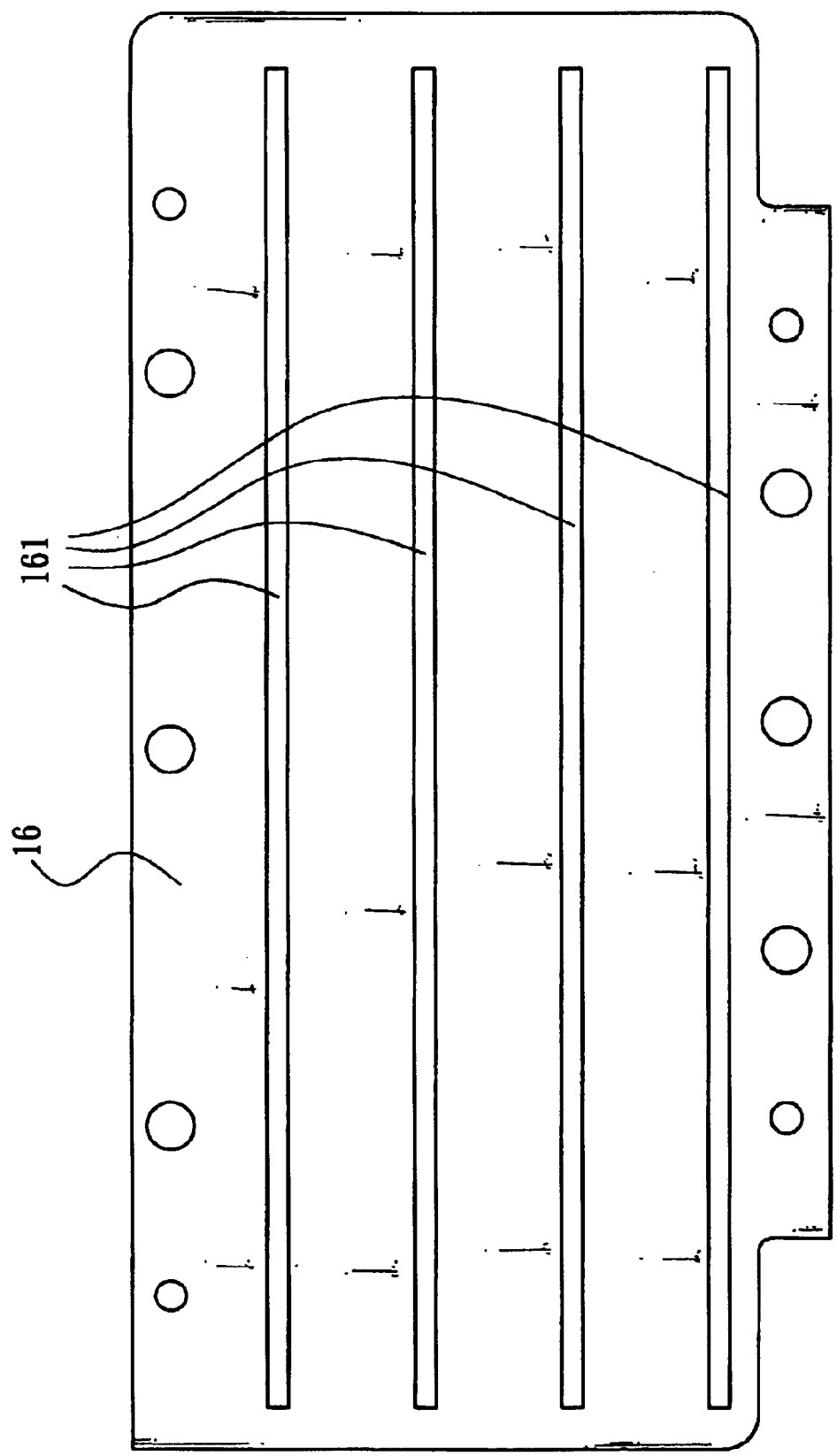
FIG. 4 is an upper view of the stationary board of the present invention.

Referring to FIG. 2, FIG. 3 and FIG. 4, a connecting slot (151) is above and connects to every corresponding extension connector (15), the connecting area of the circuit board (21) can connect to the connecting slot (151) and connect to the corresponding extension connector (15), a connecting pin (153) is beneath on each of the extension connector (15) to connect to the connecting port (23) of the mainboard (20), a positioning board (16) is beneath every extension connector (15), the positioning board (16) corresponds to the location of the connecting pin (153) of the extension connector (15), a positioning hole (161) is for the corresponding connecting pin (153) to pass through, when the connecting pin (153) passes through the corresponding positioning hole (161), by the guidance and positioning of the positioning hole (161), the connecting pin (153) can move up and down in a preset path; two inclined angle (163) that can prevent the fastener (231) of the connecting port (23) of the mainboard (20) from closing are on both sides of the positioning board (16), the inclined angle (163) should incline inward to fit the angle of the fastener (231) to prevent the fastener (231) from covering top of the extension connector (15).

Based on the structure described above, when the mainboard (20) are to be tested, operators move the pressing handle (131) of the hanging pedestal (13) to have the hanging pedestal (13) move down toward the connecting port (23) of the mainboard (20) until the positioning board (16) presses on the connecting port (23); the positioning board (16) stops on the connecting port (23), the pressure from the hanging pedestal (13) makes the connecting pin (153) of the extension connector (15) pass through the positioning hole (161) of the positioning board (16) and reach the connecting port (23) accurately, the mainboard (20) can be tested with accompanied circuit board (21).

The present invention can have the mainboard (20) accurately connect to the circuit board (21) while testing to avoid the human errors of manual plugging in and pulling out of the circuit board (21), the labor cost and time can also be shorter.

Referring to FIG. 1, several connecting plate (133) link the support rod (123) of the frame (12) of the hanging pedestal (13), a plurality number of screw holes are on the connecting plate (133) to have the connecting component (1331), screws for example, to link the connecting plate (133) and the support rod (123) to stable the hanging pedestal (13) and the frame (12), operators can loose the connecting component (1331) and move the hanging pedestal (13) right or left for proper position.

Referring to FIG. 1 and FIG. 2, both ends of the support rod (123) wrap around the round tube (125) on both sides of the frame (12), such structure makes the support rod (123) can move forward or backward; operators can adjust the position of the support rod (123) to make the hanging pedestal (13) to the position of the connecting port (23) of the mainboard (20).

Referring to FIG. 1, the platform (11) consists of a the stationary board (111) and an adjustable board (113); a base for the mainboard (20) to install is above the adjustable board (113), a plurality number of wheels in vertical direction (not shown in FIG) in equal distance are installed on the bottom of the adjustable board (113), the stationary board (111) locates inside the frame (12) that is beneath the adjustable board (113); a plurality number of wheel slot (1111) are beneath those wheels and above the stationary board (111), the wheels can roll inside the wheel slot (1111) to make the adjustable board (113) move forward or backward on the stationary board (111); such movement can push the mainboard (20) into the frame (12) for testing, after testing, the mainboard (20) can be pulled out from the frame (12).

Referring to FIG. 1, a hard disk drive can be installed on the adjustable board (113) of the platform (11), the hard disk drive contains OS and other related information, when the hard disk drive connects to the mainboard (20) and runs the test procedure, the OS inside the hard disk drive can boot up the system, run the test routines inside the hard disk drive and interchange information or programs.

Referring to FIG. 1, a CD ROM and a floppy disk drive can be installed on the adjustable board (113) of the platform (11), the CD ROM and the floppy disk drive can connect to the mainboard (20) through communication wires, while testing the mainboard (20), the data or routines inside the CD ROM and the floppy disk drive can be interchanged.

Referring to FIG. 1, FIG. 2 and FIG. 3, at least one elastic component (17) locates between the board slot (14) and the positioning board (16), when the test is done, operators pull the pressing handle (131) to lift the hanging pedestal (13), the elastic component (17) can pull the connecting pin (153) of the extension connector (15) off the connecting port (23) easier.

Figure 5:
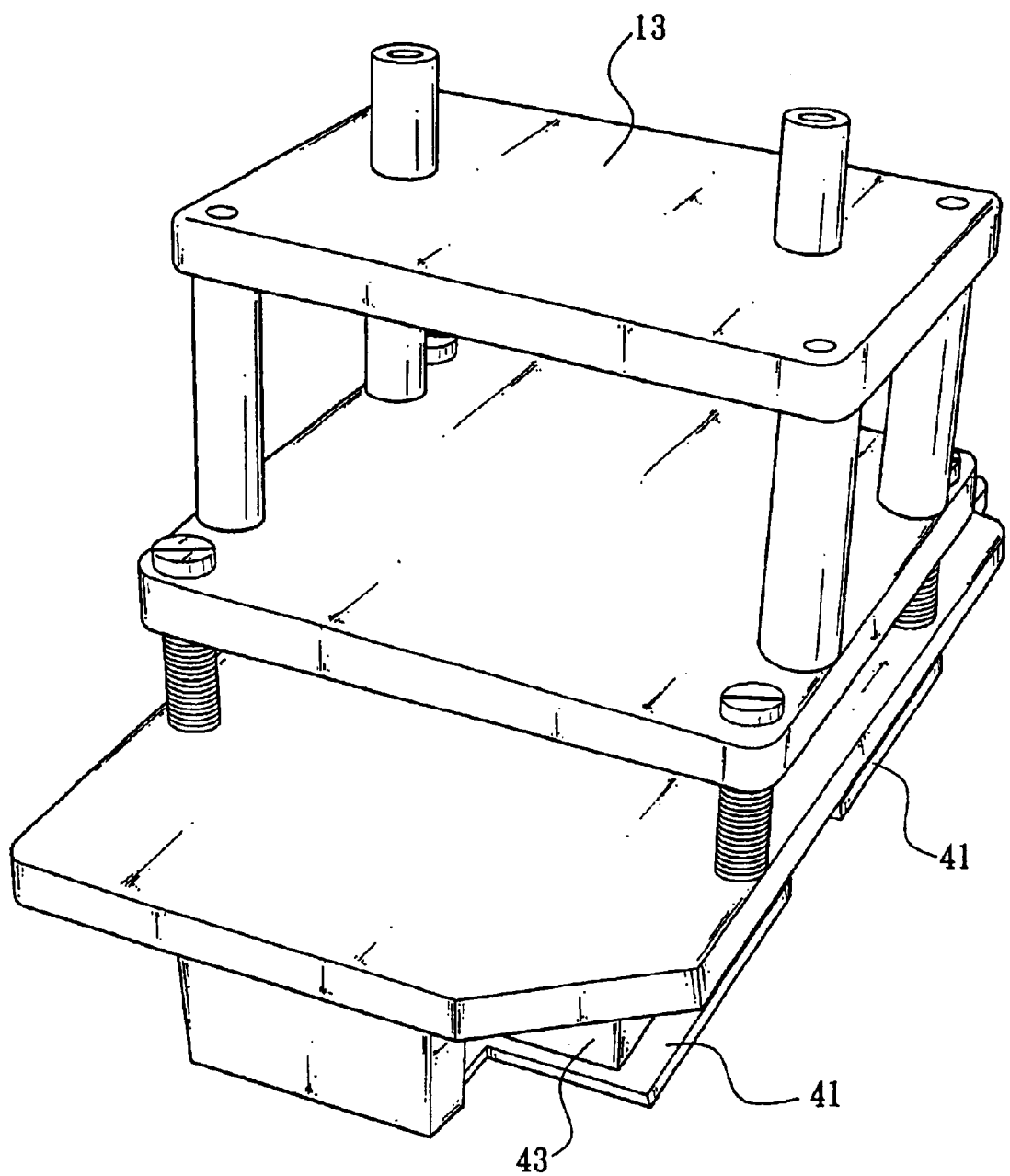
FIG. 5 is an application view in accordance with the present invention.

Referring to FIG. 1 and FIG. 5, the pressing handle (131) above the hanging pedestal (13) can move the hanging pedestal (13) up and down; a heat sink slot (43) to install a heat sink (41) is beneath the hanging pedestal (13), when operators perform heat dissipation test, the hanging pedestal (13) is moved up to the position of the CPU of the mainboard (20), then pull the pressing handle (131) of the hanging pedestal (13) to have the heat sink slot (43) move down and have the heat sink (41) on the surface of the CPU of the mainboard (20) for test.

Figure 6:
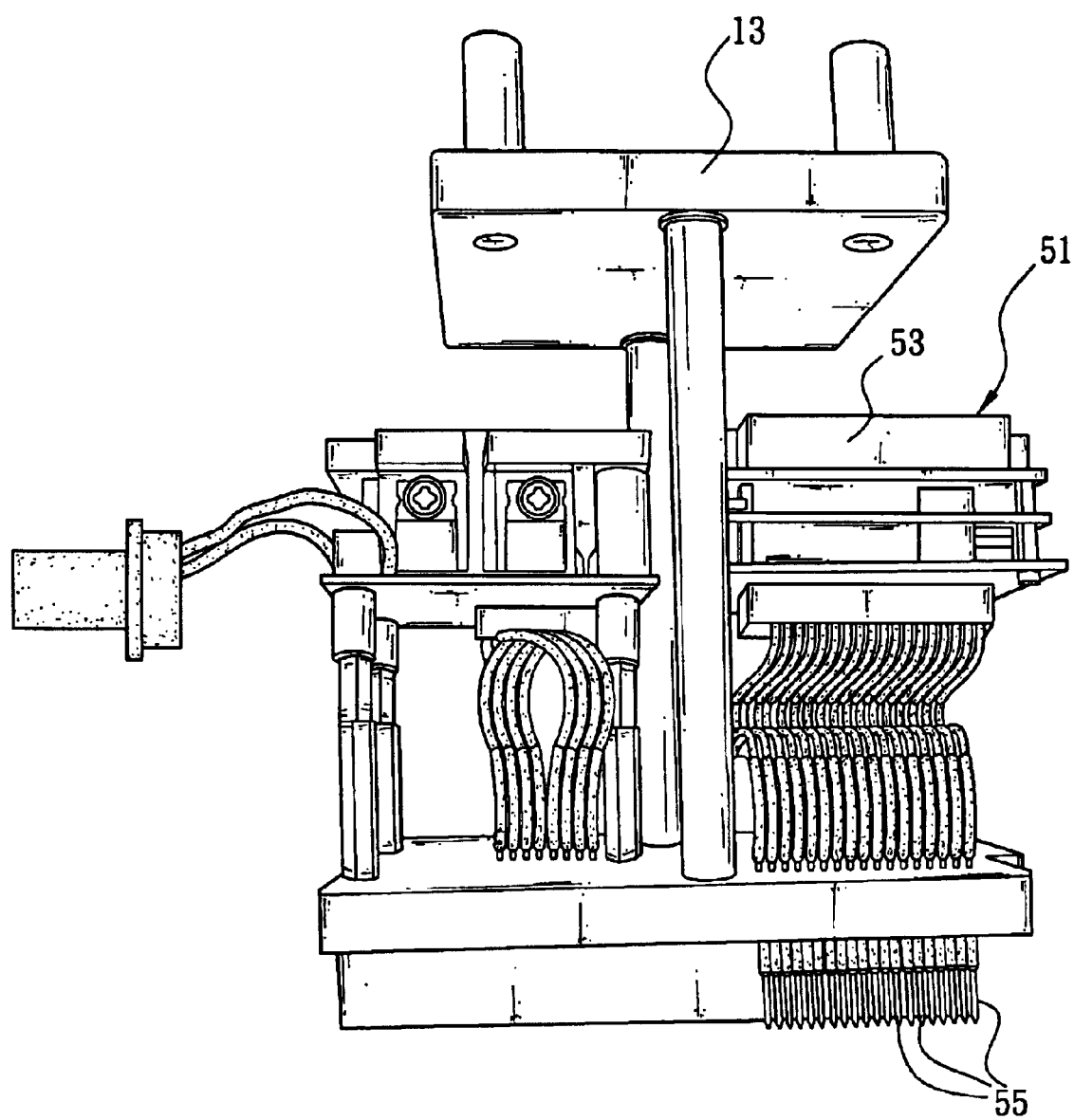
FIG. 6 is another application view in accordance with the present invention.

Referring to FIG. 1 and FIG. 6, the pressing handle (131) above the hanging pedestal (13) can move the hanging pedestal (13) up and down; a peripheral connector (51) with a peripheral connecting port (53) is beneath the hanging pedestal (13), the peripheral connecting port (53) connects to the peripheral devices, printer, screen, scanner, keyboard, mouse . . . , a plurality number of peripheral connecting pin (55) are beneath the peripheral connector (51) to connect to the other peripheral connecting ports (PR-232 for example) (not shown in FIG) of the mainboard (20); when operators perform test, the hanging pedestal (13) is moved up to the mainboard (20), then pull the pressing handle (131) of the hanging pedestal (13), the peripheral connector (51) goes down to have the peripheral connecting pin (55) connect to the corresponding circuit, the peripheral connector (51) with the peripheral devices connect to the mainboard (20) for testing and interchanging information with the mainboard (20).

While a preferred embodiment of the invention has been shown and described in detail, it will be readily understood and appreciated that numerous omissions, changes and additions may be made without departing from the spirit and scope of the invention.

What is claimed is:

1. A PC mainboard test fixture comprising:
   a platform to install the mainboard;
   a frame located on the platform, said frame consists of a plurality number of pole, a plurality number of round tube as beam and several support rod installed among those said pole;

at least one hanging pedestal installed freely on said support rod, a pressing handle is on each of said hanging pedestal to move said hanging pedestal up or down, a board slot for the circuit board to fit in located beneath every said hanging pedestal;

a plurality number of extension connector located beneath every said board slot to connect to said circuit board, a plurality number of connecting slots located above and connected to said every corresponding extension connector; and a positioning board being beneath every said extension connector, said positioning board corresponds to the location of the connecting pin of said extension connector, a positioning hole is for the corresponding connecting pin to pass through, when said connecting pin passes through said corresponding positioning hole, by the guidance and positioning of said positioning hole, said connecting pin can move up and down in a preset path.

2. The PC mainboard test fixture recited in claim 1, wherein several connecting plate linking said support rod of said frame, a plurality number of screw holes are on said connecting plate to have the connecting components to link said connecting plate and said support rod to stable said hanging pedestal and said frame, when said connecting components loosen, said hanging pedestal can be moved right or left for proper position.

3. The PC mainboard test fixture recited in claim 2, wherein said connecting components being screws.

4. The PC mainboard test fixture recited in claim 2, wherein both ends of said support rod wrapping around said round tube on both sides of said frame, such structure makes said support rod to move forward or backward, operators can adjust the position of said support rod to make said hanging pedestal to the position of said connecting port of said mainboard.

5. The PC mainboard test fixture recited in claim 1, wherein said platform consists of a the stationary board and an adjustable board, a base for said mainboard to install is above said adjustable board, a plurality number of wheels in vertical direction in equal distance are installed on the bottom of said adjustable board, said stationary board locates inside said frame that is beneath said adjustable board, a plurality number of wheel slot are beneath those wheels and above said stationary board, the wheels can roll inside said wheel slot to make said adjustable board move forward or backward on said stationary board, such movement can push said mainboard into the frame for testing, after testing, said mainboard can be pulled out from the frame after test.

6. The PC mainboard test fixture recited in claim 4, wherein said pressing handle located above said hanging pedestal can move said hanging pedestal up and down, a heat sink slot to install a heat sink locates beneath said hanging pedestal, during heat dissipation test, said hanging pedestal is moved up to the position of the CPU of said mainboard, then pull said pressing handle of said hanging pedestal to have said heat sink slot move down and have said heat sink on the surface of the CPU of said mainboard.

7. The PC mainboard test fixture recited in claim 4, wherein said pressing handle located above said hanging pedestal can move said hanging pedestal up and down, a peripheral connector with a peripheral connecting port is beneath said hanging pedestal, said peripheral connecting port connects to the peripheral devices, a plurality number of peripheral connecting pin are beneath said peripheral connector to connect to the other peripheral connecting ports of said mainboard, said peripheral connector with the peripheral devices connect to said mainboard for testing and interchanging information with said mainboard.

8. The PC mainboard test fixture recited in claim 7, wherein said peripheral devices being a printer.

9. The PC mainboard test fixture recited in claim 1, wherein two inclined angles that preventing the fastener of said connecting port of said mainboard from closing are on both sides of said positioning board, said inclined angles incline inward to fit the angle of said fastener to prevent said fastener from covering top of said extension connector.

10. The PC mainboard test fixture recited in claim 1, wherein said circuit board being a network card.

* * * * *